US009996010B2

(12) United States Patent
Endres

(10) Patent No.: US 9,996,010 B2
(45) Date of Patent: Jun. 12, 2018

(54) ILLUMINATION OPTICAL ASSEMBLY FOR PROJECTION LITHOGRAPHY

(71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/439,020

(22) Filed: Feb. 22, 2017

(65) Prior Publication Data
US 2017/0160644 A1 Jun. 8, 2017

Related U.S. Application Data

(63) Continuation of application No. PCT/EP2015/069216, filed on Aug. 21, 2015.

(30) Foreign Application Priority Data

Sep. 3, 2014 (DE) .......................... 10 2014 217 610

(51) Int. Cl.
*G03B 27/54* (2006.01)
*G03F 7/20* (2006.01)
*G02B 5/09* (2006.01)

(52) U.S. Cl.
CPC ............ *G03F 7/70116* (2013.01); *G02B 5/09* (2013.01); *G03F 7/702* (2013.01); *G03F 7/70075* (2013.01)

(58) Field of Classification Search
CPC ..... G02B 5/0891; G02B 5/09; G03F 7/70075; G03F 7/70016; G03F 7/702
(Continued)

(56) References Cited

U.S. PATENT DOCUMENTS

2006/0132747 A1  6/2006  Singer et al.
2010/0231882 A1  9/2010  Dinger et al.
(Continued)

FOREIGN PATENT DOCUMENTS

DE         10317667 A1    11/2004
DE     102008009600 A1     8/2009
(Continued)

OTHER PUBLICATIONS

International Search Report and Written Opinion of corresponding PCT Appl No. PCT/EP2015/069216, dated Jan. 7, 2016.
(Continued)

*Primary Examiner* — Colin Kreutzer
(74) *Attorney, Agent, or Firm* — Fish & Richardson P.C.

(57) ABSTRACT

An illumination optical assembly for projection lithography serves for illuminating an object field, in which an object to be imaged is arrangeable. The object field has a scan length along an object displacement direction. The illumination optical assembly has two facet mirrors for the reflective guidance of illumination light towards the object field. Second facets of the second facet mirror serve for guiding a respective illumination light partial beam into the object field. The second facet mirror is a pupil distance from a pupil plane of the illumination optical assembly that is closest adjacent to the second facet mirror. The second facets are arranged in a grid, wherein at least one grid constant of the grid is predefined by the pupil distance and by the scan length. This results in an illumination optical assembly which achieves an illumination of predefined pupil sections that is relatively homogeneous.

20 Claims, 12 Drawing Sheets

(58) Field of Classification Search
USPC .......................................................... 355/67
See application file for complete search history.

(56) References Cited

U.S. PATENT DOCUMENTS

2011/0001947 A1  1/2011  Dinger et al.
2011/0122392 A1  5/2011  Fiolka et al.

FOREIGN PATENT DOCUMENTS

DE   102012210961 A1   6/2013
WO   WO 2010/099807 A   9/2010

OTHER PUBLICATIONS

German Office Action, with translation thereof, for corresponding DE Appl No. 10 2014 217 610.7, dated Feb. 19, 2015.

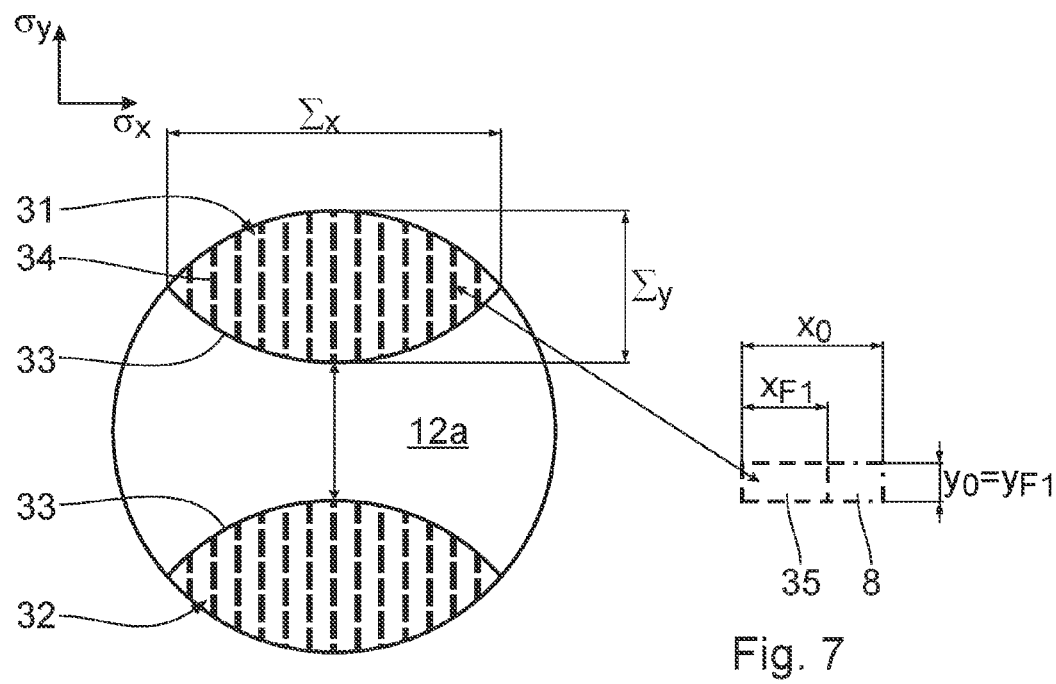
Fig. 6
Fig. 7
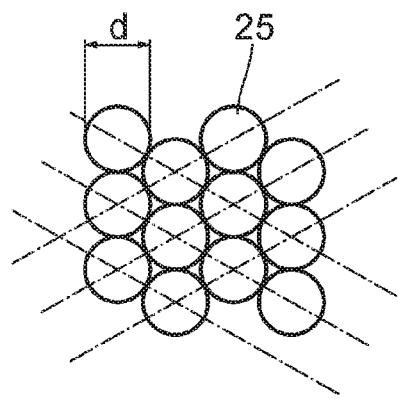
Fig. 8

ILLUMINATION OPTICAL ASSEMBLY FOR PROJECTION LITHOGRAPHY

CROSS-REFERENCE TO RELATED APPLICATIONS

The present application is a continuation of, and claims benefit under 35 USC 120 to, international application PCT/EP2015/069216, filed Aug. 21, 2015, which claims benefit under 35 USC 119 of German Application No. 10 2014 217 610.7, filed Sep. 3, 2014. The entire disclosure of international application PCT/EP2015/069216 and German Application No. 10 2014 217 610.7 are incorporated by reference herein.

FIELD

The disclosure relates to an illumination optical assembly for projection lithography. Furthermore, the disclosure relates to an optical system including such an illumination optical assembly, an illumination system including such an illumination optical assembly, a projection exposure apparatus including such an optical system, a method for producing a micro- or nanostructured component, and a component produced by the method.

BACKGROUND

An illumination optical assembly including a transfer optical assembly and at least one illumination predefinition facet mirror displaced downstream is known from WO 2010/099807 A1 and US 2006/0132747 A1.

SUMMARY

The present disclosure seeks to develop an illumination optical assembly so that an illumination of predefined pupil sections of the illumination optical assembly that is as homogeneous as possible is achieved.

In one aspect, the disclosure provides an illumination optical assembly as part of an illumination system for projection lithography for illuminating an object field, in which an object to be imaged is arrangeable, which is displaced during a projection exposure in an object displacement direction through the object field. The illumination optical assembly includes a first facet mirror having first facets for the reflective guidance of illumination light. The illumination optical assembly also includes a second facet mirror for the reflective guidance of the illumination light reflected by the first facet mirror towards the object field. The second facet mirror has second facets for guiding a respective illumination light partial beam into the object field. The second facet mirror is at a distance from a pupil plane of the illumination optical assembly. The illumination optical assembly is embodied such that with the use of an EUV light source for generating the illumination light partial beams an entrance pupil in the pupil plane has at least one extended, illuminated pupil region on which the illumination light impinges via a plurality of second facets. Within the illuminated pupil region an area of less than 10% of the pupil region is impinged on by a limit illumination intensity which is less than 10% of a mean illumination intensity that impinges on the pupil region.

According to the disclosure, it has been recognized that a pupil illumination in accordance with the specified limit values leads to a particularly good homogenization of illuminated pupil regions of the entrance pupil. The illuminated pupil region can be impinged on overall, that is to say without gaps, with a limit illumination intensity which is at least 10% of a mean illumination intensity that impinges on the pupil region. This lower limit value can also be greater than 10% and for example 20%, 30%, 40% or 50%. Insofar as gaps remain in the illuminated pupil region, which gaps are impinged on by a limit illumination intensity which is less than 10% of the mean illumination intensity, then these gaps can be significantly smaller than 10% and for example 8%, 5%, 3%, 2% or 1% of the illuminated pupil region. An illumination intensity distribution of the entrance pupil which arises in a scan-integrated manner for an object to be illuminated can have pupil regions which are illuminated via more than one second facet, for example via two second facets or via three second facets. This also contributes to the homogenization of the illuminated pupil regions of the entrance pupil. With the illumination optical assembly and a corresponding light source, an illumination system can arise in which, in a scan-integrated manner, a homogeneous illumination with the illumination light results over the predefined pupil region to be illuminated, which deviates from a predefined value by less than a tolerance value.

In one aspect, the disclosure provides an illumination optical assembly for projection lithography for illuminating an object field, in which an object to be imaged is arrangeable, which is displaced during a projection exposure in an object displacement direction through the object field. The object field has a scan length along the object displacement direction. The illumination optical assembly includes a first facet mirror having first facets for the reflective guidance of illumination light. The illumination optical assembly also includes a second facet mirror for the reflective guidance of the illumination light reflected by the first facet mirror towards the object field. The second facet mirror has second facets for guiding a respective illumination light partial beam into the object field. The second facet mirror is at a pupil distance from a pupil plane of the illumination optical assembly that is closest adjacent to the second facet mirror. The second facets are arranged in a grid. At least one grid constant of the grid is predefined by the pupil distance and by the scan length. Such an illumination optical assembly is particularly well suited to lithographic projection exposure. The advantages of this illumination optical assembly correspond to those which have already been explained above. The grid constant of a facet arrangement of the second facets of the second facet mirror depending firstly on a pupil distance between the second facet mirror and the pupil plane adjacent thereto and depending secondly on a scan length, that is to say an extent of the object field in the object displacement direction, leads to an optimization of an illumination homogeneity in the pupil plane. A correspondingly improved object illumination is the consequence, which has a positive influence on a structure resolution during the projection exposure. In this case, the grid constant of the arrangement is not strictly constant, in order to take account of optical boundary conditions on account of different spatial beam guiding geometries for the illumination light partial beams along illumination channels which are predefined by the facets of the two facet mirrors that in each case guide an illumination light partial beam. The selection of the grid constants depending on the pupil distance and the scan length results in a reduction of an illumination inhomogeneity on account of a transition during the illumination of an object point on account of the displacement thereof through the object field from one illumination light partial beam to another illumination light partial beam. A homogenization is therefore achieved even if an object point is illuminated by different illumination light partial beams from one and the same illumination direction during its displacement through the object field. A partial field illumination by the different illumination light partial beams is therefore not disturbing when obtaining an illumination homogeneity over the entire object field. The pupil distance represents a measure of a light path between an entrance pupil arranged in the pupil plane, on the one hand, and the second facet mirror, on the other hand.

The second facets can be arranged in a Cartesian grid, the lines and columns of which extend perpendicularly and parallel to the object displacement direction. Respectively adjacent lines of the second facets which extend perpendicularly to the object displacement direction can be shifted relative to one another by a submultiple of the grid constants. The second facets can be arranged in a hexagonal grid. The second facets can be arranged in a Cartesian grid, the lines and columns of which extend at an angle of between 10° and 80° with respect to the object displacement direction. The second facets can be arranged in a Cartesian grid, the lines and columns of which extend at an angle of 45° with respect to the object displacement direction. The grid can have more than one grid constant. The aforementioned grid arrangements have proven to be particularly suitable.

In the case of an arrangement where respectively adjacent lines of the second facets which extend perpendicularly to the object displacement direction are shifted relative to one another by a submultiple of the grid constants, a shift in particular by half the grid constant can be implemented, which leads to a particularly good homogenization.

For a Cartesian grid where the second facets are arranged in a Cartesian grid, the lines and columns of which extend at an angle of between 10° and 80° with respect to the object displacement direction, adjacent lines can be shifted relative to one another by half a grid constant. Adjacent lines can also be shifted relative to one another for example by one third or by a different fraction smaller than half of the grid constants.

In the case of more than one grid constant, this can take account of different imaging scans of a projection optical assembly that images the object field into an image field.

The features of the illumination optical assemblies of both aspects explained above can be combined with one another in any desired way.

An illumination system include an illumination optical assembly described herein. An optical system can include an illumination optical assembly as described herein and a projection optical assembly for imaging the object field into an image field. A projection exposure apparatus can include such an optical system and a light source. A method for producing a microstructured component can include providing a reticle, providing a wafer having a coating that is sensitive to the illumination light, projecting at least one section of the reticle onto the wafer with the aid of a projection exposure apparatus described herein, and developing the light-sensitive layer exposed with the illumination light on the wafer. The component produced can be a semiconductor element, especially a microchip, in particular a memory chip.

The advantages of embodiments described in the preceding paragraph correspond to those which have already been explained above with reference to the illumination optical assembly.

BRIEF DESCRIPTION OF THE DRAWINGS

Exemplary embodiments of the disclosure are explained in greater detail below with reference to the drawing, in which:

FIG. 6 shows schematically a plan view of a scan-integrated pupil intensity distribution in the case of a y-dipole illumination setting with use of the illumination optical assembly according to FIGS. 1 and 2 with an illumination predefinition facet mirror arranged at a distance from a pupil plane of the illumination optical assembly;

FIG. 7 shows schematically an excerpt from the object field which is illuminated via an illumination predefinition facet in the case of the illumination setting according to FIG. 6;

FIG. 8 shows an enlarged excerpt from a facet arrangement of the illumination predefinition facet mirror according to FIG. 5, wherein illumination predefinition facets are arranged hexagonally;

DETAILED DESCRIPTION

Figure 1:
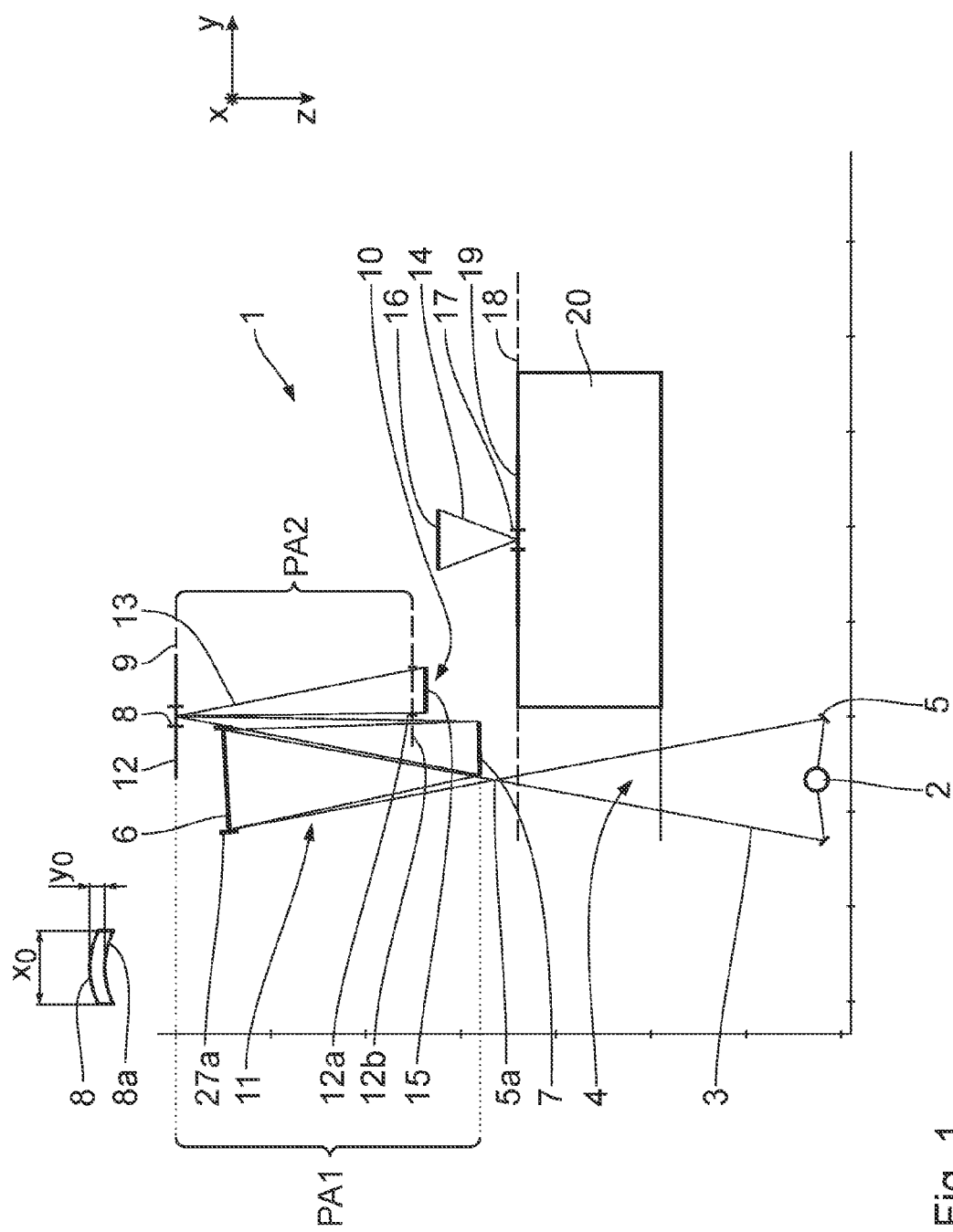
FIG. 1 shows highly schematically in meridional section a projection exposure apparatus for EUV microlithography including a light source, an illumination optical assembly and a projection optical assembly.

A projection exposure apparatus 1 for microlithography that is illustrated highly schematically and in meridional section in FIG. 1 has a light source 2 for illumination light 3. The light source 2 is an EUV light source that generates light in a wavelength range of between 5 mm and 30 mm. This can be an LPP (Laser Produced Plasma) light source, a DPP (Discharge Produced Plasma) light source or a synchrotron-radiation-based light source, for example a free electron laser (FEL).

For guiding the illumination light 3, proceeding from the light source 2, use is made of a transfer optical assembly 4. The latter has a collector 5, which is illustrated only with regard to its reflective effect in FIG. 1, and a transfer facet mirror 6, which is described in even greater detail below and which is also designated as first facet mirror or as field facet mirror. An intermediate focus 5a of the illumination light 3 is arranged between the collector 5 and the transfer facet mirror 6. A numerical aperture of the illumination light 3 in the region of the intermediate focus 5a is NA=0.182, for example. An illumination predefinition facet mirror 7, which is also designated as second or further facet mirror and is likewise explained in even greater detail below, is disposed downstream of the transfer facet mirror 6 and thus the transfer optical assembly 4. The optical components 5 to 7 are parts of an illumination optical assembly 11 of the projection exposure apparatus 1.

The transfer facet mirror 6 is arranged in a field plane of the illumination optical assembly 11.

The illumination predefinition facet mirror 7 of the illumination optical assembly 11 is arranged at a distance from pupil planes of the illumination optical assembly 11. Such an arrangement is also designated as specular reflector.

A reticle 12 is disposed downstream of the illumination predefinition facet mirror 7 in the beam path of the illumination light 3, the reticle being arranged in an object plane 9 of a downstream projection optical assembly 10 of the projection exposure apparatus 1. The projection optical assembly 10 is a projection lens. The illumination optical assembly 11 is used to illuminate an object field 8 on the reticle 12 in the object plane 9 in a defined manner. The object field 8 simultaneously constitutes an illumination field of the illumination optical assembly 11. Generally it holds true that the illumination field is formed in such a way that the object field 8 can be arranged in the illumination field.

The illumination predefinition facet mirror 7, like the transfer facet mirror 6 as well, is part of a pupil illumination unit of the illumination optical assembly 11 and serves for illuminating an entrance pupil 12a in a pupil plane 12b of the projection optical assembly 10 with the illumination light 3 with a predefined pupil intensity distribution. The entrance pupil 12a of the projection optical assembly 10 can be arranged in the illumination beam path upstream of the object field 8 or else downstream of the object field 8. FIG. 1 shows the case in which the entrance pupil 12a is arranged in the illumination beam path downstream of the object field 8. A pupil distance PA between the second facet mirror 7 and the pupil plane 12b results in this case as the sum of a z-distance PA1 between the second facet mirror 7 and the object plane 9 and the z-distance PA2 between the object plane 9 and the pupil plane 12b. It thus holds true that: PA=PA1+PA2. The pupil distance PA is measured in the beam direction. A measure of the pupil distances is a z-coordinate firstly of the entrance pupil 12a, which is designated hereinafter as zEP, and a z-coordinate of the second facet mirror 7, which is designated hereinafter as zSR, in each case proceeding from the object plane 9 (z=0).

In order to facilitate the presentation of positional relationships, a Cartesian xyz-coordinate system is used hereinafter. The x-direction runs perpendicularly to the plane of the drawing into the latter in FIG. 1. The y-direction runs towards the right in FIG. 1. The z-direction runs downwards in FIG. 1. Coordinate systems used in the drawing have x-axes running parallel to one another in each case. The course of a z-axis of the coordinate systems follows a respective principal direction of the illumination light 3 within the figure respectively under consideration.

The object field 8 has an arcuate or partly circular shape and is delimited by two mutually parallel circle arcs and two straight side edges which run in the y-direction with a length $y_0$ and are at a distance $x_0$ from one another in the x-direction. The aspect ratio $x_0/y_0$ is 13 to 1. An insert in FIG. 1 shows a plan view of the object field 8, this plan view not being true to scale. A boundary shape 8a is arcuate. In an alternative and likewise possible object field 8, the boundary shape thereof is rectangular, likewise with aspect ratio $x_0/y_0$.

The projection optical assembly 10 is indicated only in part and highly schematically in FIG. 1. An object field side numerical aperture 13 and an image field side numerical aperture 14 of the projection optical assembly 10 are illustrated. Between indicated optical components 15, 16 of the projection optical assembly 10, which components can be embodied for example as mirrors that are reflective for the EUV illumination light 3, there are situated further optical components—not illustrated in FIG. 1—of the projection optical assembly 10 for guiding the illumination light 3 between these optical components 15, 16.

The projection optical assembly 10 images the object field 8 into an image field 17 in an image plane 18 on a wafer 19, which, like the reticle 12 as well, is carried by a holder (not illustrated in more specific detail). Both the reticle holder and the wafer holder are displaceable both in the x-direction and in the y-direction via corresponding displacement drives. A structural space of the wafer holder is illustrated as a rectangular box at 20 in FIG. 1. The structural space 20 is rectangular with an extent in x-, y- and z-directions that is dependent on the components to be accommodated herein. The structural space 20 has, for example, proceeding from the centre of the image field 17, an extension of 1 m in the x-direction and in the y-direction. In the z-direction, too, the structural space 20, proceeding from the image plane 18, has an extension of 1 m, for example. The illumination light 3 has to be guided in the illumination optical assembly 11 and the projection optical assembly 10 in such a way that it is in each case guided past the structural space 20.

The transfer facet mirror 6 has a multiplicity of transfer facets 21 which are also designated as first facets. The transfer facet mirror 6 can be embodied as an MEMS mirror. The transfer facets 21 are individual mirrors which are switchable at least between two tilting positions and which are embodied as micromirrors. The transfer facets 21 can be embodied as micromirrors tiltable in a driven manner about two rotation axes perpendicular to one another.

Figure 2:
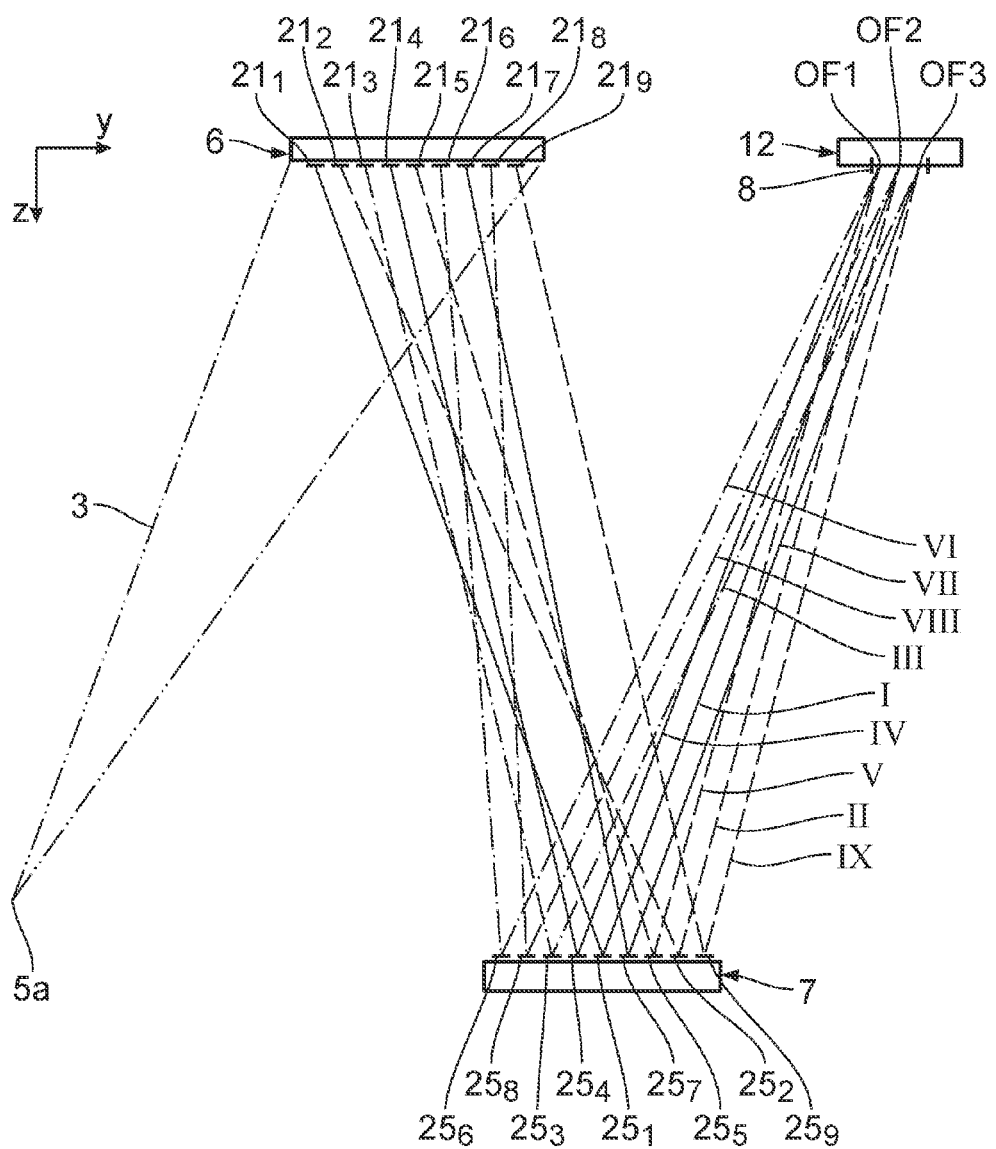
FIG. 2 shows schematically and likewise in meridional section a beam path of selected individual rays of illumination light within a pupil illumination unit of the illumination optical assembly according to FIG. 1, proceeding from an intermediate focus through to a reticle arranged in the object plane of the projection optical assembly in the region of an illumination or object field.

From the individual mirrors or transfer facets 21, a line having a total of nine transfer facets 21 is illustrated schematically in the yz-sectional view according to FIG. 2, the transfer facets being indexed from left to right by $21_1$ to $21_9$ in FIG. 2. In actual fact, the transfer facet mirror 6 has a significantly greater multiplicity of the transfer facets 21.

Figure 4:
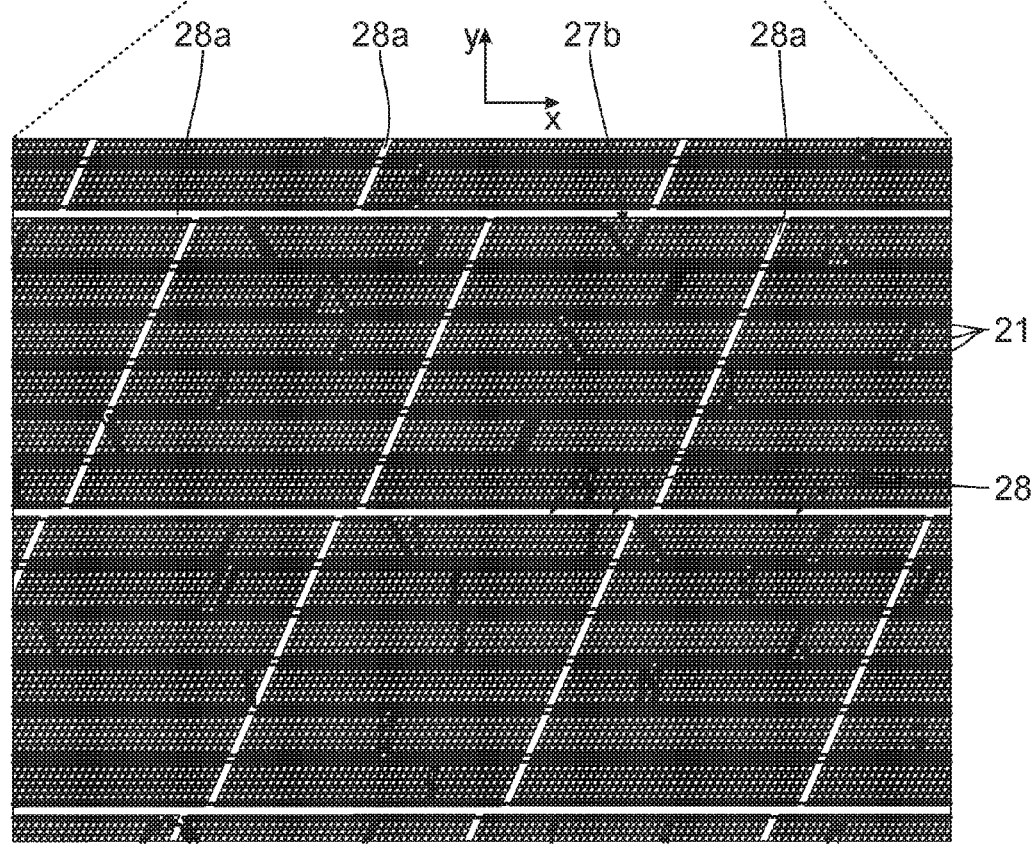
FIG. 4 shows an enlarged excerpt from FIG. 3, which illustrates a subdivision of the transfer facet mirror into individual mirror blocks and highlights an allocation of illuminated sections on the transfer facet mirror which constitute virtual facet groups or individual mirror groups to which illumination predefinition facets of a illumination predefinition facet mirror disposed downstream in the illumination optical assembly are assigned by illumination channels, wherein an x-dipole illumination setting is set by the two facet mirrors.

The transfer facets 21 are grouped into a plurality of transfer facet groups not illustrated in more specific detail in FIG. 2 (in this respect, cf. in particular FIG. 4). These transfer facet groups are also designated as individual mirror groups, virtual field facets or as virtual facet groups.

Each of the transfer facet groups guides a portion of the illumination light 3 via an illumination channel for partial or complete illumination of the object field 8. Via the illumination channel and an illumination light partial beam $3_i$ guided via the latter (cf. e.g. FIG. 8), exactly one illumination predefinition facet 25 of the illumination predefinition facet mirror 7 is assigned in each case to one of the individual mirror groups or transfer facet groups. In principle, each of the illumination predefinition facets 25 can for their part in turn be constructed from a plurality of individual mirrors. The illumination predefinition facets 25 are also designated hereinafter as second facets.

For further details of possible embodiments of the transfer facet mirror 6 and the projection optical assembly 10, reference is made to WO 2010/099 807 A.

At least some of the illumination predefinition facets 25 illuminate only a partial zone or partial field of the object field 8. The partial fields are very individually shaped and, moreover, are dependent on the desired illumination direction distribution (pupil shape) in the object field 8, that is to say the illumination setting. The illumination predefinition facets 25 are therefore illuminated by very different shaped virtual field facets, the shape of which corresponds precisely to the shape of the respective partial field to be illuminated. Moreover, each illumination predefinition facet 25 contributes to different regions of the pupil depending on the location in the object field 8.

The illumination predefinition facet mirror 7 can be embodied as an MEMS mirror, particularly if each of the illumination predefinition facets 25 is constructed from a plurality of individual mirrors. The illumination predefinition facets 25 are micromirrors switchable between at least two tilting positions. The illumination predefinition facets 25 are embodied as micromirrors which are tiltable in a driven manner about two mutually perpendicular tilting axes continuously and independently, that is to say can be positioned into a multiplicity of different tilting positions.

One example of a predefined assignment of individual transfer facets 21 to the illumination predefinition facets 25 is illustrated in FIG. 2. The illumination predefinition facets 25 respectively assigned to the transfer facets $21_1$ to $21_9$ are indexed according to this assignment. The illumination predefinition facets 25 are illuminated from left to right on the basis of this assignment in the order $25_6$, $25_8$, $25_3$, $25_4$, $25_1$, $25_7$, $25_5$, $25_2$ and $25_9$.

The indices 6, 8 and 3 of the facets 21, 25 include three illumination channels VI, VIII and III, which illuminate three object field points OF1, OF2, OF3, which are numbered from left to right in FIG. 2, from a first illumination direction. The indices 4, 1 and 7 of the facets 21, 25 belong to three further illumination channels IV, I, VII, which illuminate the three object field points OF1 to OF3 from a second illumination direction. The indices 5, 2 and 9 of the facets 21, 25 belong to three further illumination channels V, II, IX, which illuminate the three object field points OF1 to OF3 from a third illumination direction.

The illumination directions assigned to
the illumination channels VI, VIII, III,
the illumination channels IV, I, VII and
the illumination channels V, II, IX
are identical in each case. The assignment of the transfer facets 21 to the illumination predefinition facets 25 is therefore such that a telecentric illumination of the object field 8 results in the case of the illumination example illustrated pictorially.

The illumination of the object field 8 via the transfer facet mirror 6 and the illumination predefinition facet mirror 7 can be carried out in the manner of a specular reflector. The principle of the specular reflector is known from US 2006/0132747 A1.

Figure 3:
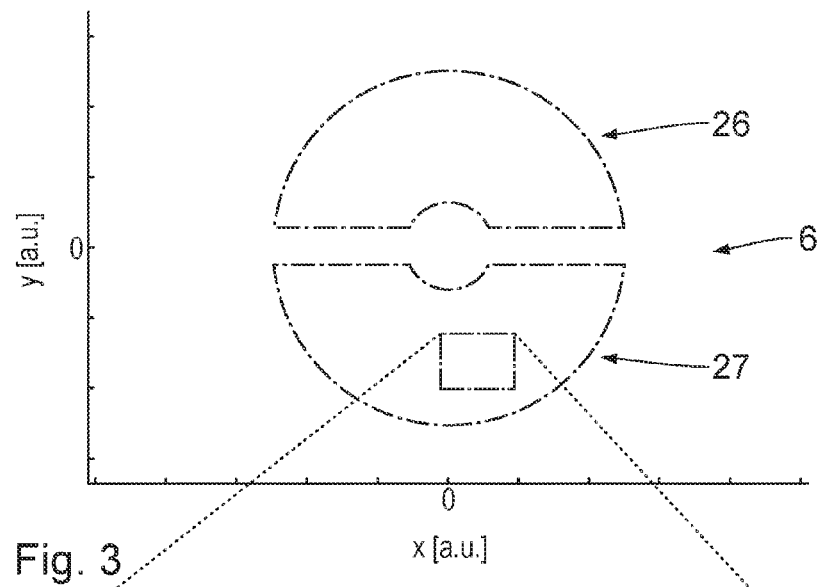
FIG. 3 shows a plan view of a transfer facet mirror of the illumination optical assembly, the mirror being arranged in a field plane.

FIG. 3 shows a plan view of the transfer facet mirror 6. The number of transfer facets 21 on the transfer facet mirror 6 is so great that individual transfer facets 21 are not discernible in FIG. 3. The transfer facets 21 are arranged in blocks in two approximately semicircular facet regions 26, 27 that are illuminated with a far field 27a (cf. FIG. 1) of the illumination light 3.

FIG. 4 shows, in an excerpt from FIG. 3, a subdivision of the transfer facet mirror 6 into a plurality of individual mirror blocks 27b each having an edge contour in the form of a parallelogram. Each of the individual mirror blocks 27b has approximately 40×40 of the individual mirrors 21. FIG. 4 furthermore highlights an allocation of the transfer facets 21 to the transfer facet groups 28, that is to say to the virtual field facets. A grouping of the transfer facets or individual mirrors 21 of the transfer facet mirror 6 into the transfer facet groups or individual mirror groups 28 is carried out by common tilting of the individual mirrors 21 into a predefined tilting position. The tilting positions of the individual mirrors of exactly one individual mirror group 28 are generally very similar to one another and generally differ more greatly from the tilting positions of adjacent individual mirrors 21 belonging to other individual mirror groups 28. The transfer facet groups 28 are in each case imaged into the object field 8 via the illumination predefinition facet mirror 7. All transfer facets 21 of a respective one of the transfer facet groups 28 illuminate one and the same illumination predefinition facet 25.

The occupation of the transfer facet mirror 6 with transfer facet groups 28 according to FIG. 4 is designed for an illumination pupil of the illumination optical assembly 11 with a specific illumination setting, that is to say for a specific, predefined intensity distribution of the illumination light in the illumination pupil.

One example of such an illumination setting is a dipole illumination setting. In a pupil plane of the illumination optical assembly 11, in the case of such an illumination setting, two illuminated pupil regions spaced apart from one another in a pupil coordinate $\sigma_{x/y}$ are present.

In the case of the occupation according to FIG. 4, the transfer facet groups 28 are predominantly rectangular.

The individual mirror groups 28 cover the far field 27a of the EUV illumination light 3 at the location of the transfer facet mirror 6 by more than 80%. Coverages by more than 85%, by more than 90% or even higher coverages still are possible.

In FIG. 4, the transfer facets 21 have the shape of parallelograms which, like the individual mirror blocks 27b as well, are sheared perpendicular to the scan direction. The transfer facets 21 are seated on facet carrier components that form the individual mirror blocks 27b. Block interspaces 28a of the individual mirror blocks 27b can be discerned as wide white bars without transfer facets 21 in horizontal and oblique orientation in FIG. 4. The block interspaces 28a have a greater extent than mirror interspaces between two individual mirrors 21 situated alongside one another adjacently within one of the individual mirror blocks 27b. The transfer facet groups 28 are identified by boundary lines having the course of polygon progressions. The transfer facet groups 28 usually extend across a plurality of individual mirror blocks 27b. For the predefined illumination setting, the transfer facet groups 28 are predominantly almost rectangular or trapezium-shaped and have only very small gaps of unused individual mirrors 21 between adjacent transfer facet groups 28. The gaps between the individual transfer facet groups 28 are illustrated in more than proportional size in FIG. 4. The area proportion of the gaps in relation to the area of the entire facet carrier components is less than 10%.

The transfer facet groups 28 serve for illuminating a rectangular object field 8. The illumination predefinition facets 25 serve for the reflective, superimposing guidance of partial beams of the illumination light 3 towards the object field 8. A position of the respective illumination predefinition facet 25 on the illumination predefinition facet mirror 7 predefines an illumination direction for the field points of the object field 8. An x-extension of the transfer facet groups 28 is such that the image of the respective transfer facet group 28 maximally covers the entire object field 8 in the x-direction. The same correspondingly holds true for the y-extension of the transfer facet groups 28. As can be gathered from the enlarged excerpt according to FIG. 4, there are many transfer facet groups 28 whose x-extension is smaller than a maximum possible x-extension, such that an image of the transfer facet groups 28 in the object field 8 in the x-dimension illuminates only a part of the object field 8.

Depending on the illumination setting to be predefined via the illumination optical assembly 11, there exists for each illumination predefinition facet 25, that is to say for each illumination channel, a maximum partial zone or partial field of the object field 8 which can be illuminated by the given illumination channel from directions that are contained in the illumination setting to be predefined. This maximum partial field size can attain the size of the entire object field 8, but in particular in the x-direction can also be smaller than the x-extension of the object field 8.

Figure 5:
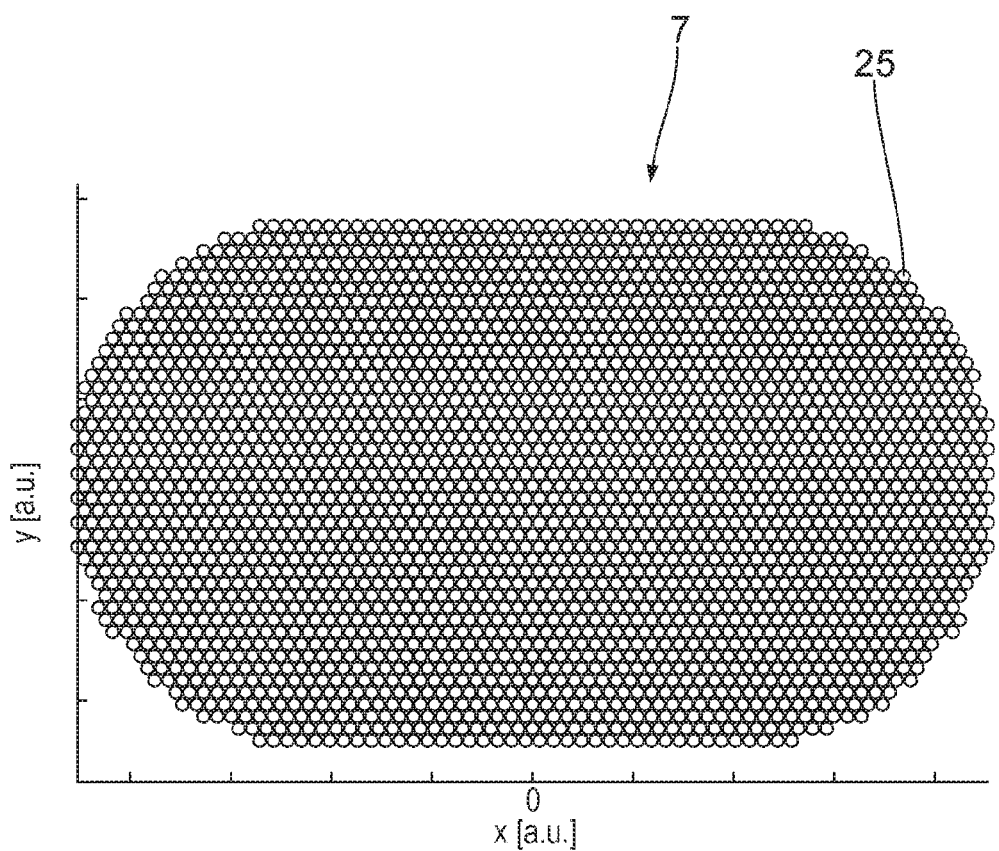
FIG. 5 shows a plan view of the illumination predefinition facet mirror of the illumination optical assembly, the mirror being arranged at a distance from a pupil plane of the illumination optical assembly.

FIG. 5 shows a plan view of the illumination predefinition facet mirror 7. The illumination predefinition facets 25 are round and are arranged in hexagonal close packed fashion on a carrier (not illustrated in more specific detail) of the illumination predefinition facet mirror 7. An edge contour of this arrangement of the illumination predefinition facets 25 on the carrier of the illumination predefinition facet mirror 7 deviates from the circular shape and is stadium-shaped, for example.

FIG. 6 shows a typical illumination of an illumination pupil 12a of the illumination optical assembly 11, which coincides with the entrance pupil of the projection optical assembly 10, and is correspondingly arranged in the pupil plane 12b in the beam path of the illumination light 3 downstream of the object field 8 (cf. FIG. 1). The pupil 12a is spanned by pupil dimensions $\sigma_x$, $\sigma_y$, assigned to the object field dimensions x, y.

FIG. 6 shows a y-dipole illumination setting having illumination poles 31, 32. A degree of filling of the pupil 12a is given by the proportion of the total area of the pupil 12a that is made up of the areas of the two illumination poles 31, 32. In this case, the area delimited by an edge 33 of the respective illumination pole 31, 32 is used as area of the respective illumination pole 31, 32. The illumination poles 31, 32 each have a biconvex-lens-shaped cross section having a maximum $\sigma_y$-extension $\Sigma_y$ in the region of a central $\sigma_x$-coordinate of the pupil 12a. In the region of this maximum extent $\Sigma_y$, approximately five pupil rods 34 arranged alongside one another along the $\sigma_y$-dimension, that is to say a respective rod-shaped illumination of the pupil 12a with the illumination light 3, contribute to the object field illumination. In a scan-integrated manner an object field point therefore "sees" the illumination light 3 from illumination directions which correspond to the position of the assigned pupil rod 34 in the pupil 12a.

FIG. 6 illustrates a scan-integrated illumination intensity within the illumination poles 31, 32. Consideration is given here to the illumination intensity which impinges on a specific point on the reticle 12 during a scan of the reticle 12 running in the y-direction through the object field 8. The y-direction is also designated as scan direction or as object displacement direction. This scan-integrated illumination intensity is distributed in the pupil 12a among pupil substructures or subpupil regions in the form of pupil rods 34 which have a larger extension in the pupil dimension $\sigma_y$ than in the pupil dimension $\sigma_x$.

The extension of the pupil rods 34 in the pupil dimension $\sigma_y$ is dependent on a difference between the reciprocal values of the z-coordinates firstly of the entrance pupil 12a and secondly of the second facet mirror 7, that is to say depending on the factor (1/zEP-1/zSR). The variables PA1 and PA2 explained above therefore influence this factor. In addition, the extension of the pupil rods 34 in the pupil dimension $\sigma_y$ is dependent on the y-extension of the object field, that is to say on the scan length $y_0$.

Between the pupil rods 34, the illumination light 3 does not impinge on the pupil 12a, as seen from the direction of exactly one field height, that is to say from the direction of exactly one x-coordinate of the object field 8. The scan-integrated illumination intensity is illustrated in FIG. 6 for that pupil 12a with which an object field point is impinged on which is scanned through the object field 8 in the y-direction with a fixed x-coordinate. For object field points along a cross-scan direction x, this results in a migration of the pupil rods 34 in the pupil dimension $\sigma_x$. If the pupil 12a is considered during a hypothetical migration in the object field 8 along the x-direction with a fixed y-coordinate, this results in a $\sigma_x$-migration of the pupil rods 34, the migration speed of which is dependent firstly on the x-migration speed in the object field 8 and secondly on the distance between the illumination predefinition facet mirror 7 and the pupil plane. In this case, arrangements can also be found in which such a "$\sigma_x$-migration" of the pupil rods 34 does not take place.

Insofar as such a "σ$_x$-migration" takes place, an illumination of the object field, with regard to a σ$_x$-illumination intensity distribution, is not identical for all x-object coordinates.

A σ$_x$-extension of the pupil rods 34 is given by a typical size of the light source 2 or of the intermediate focus 5a. A fixed point on the reticle 12 "sees" in the x-direction an x-extent of secondary light sources on the second facets 25. In the y-direction, a fixed point on the reticle 12 sees a convolution of an extent of the secondary light sources in the y-direction in the ideal case with a rectangular function representing a pupil migration along the scan direction y. This size of the pupil migration in the scan direction y is taken into account via corresponding coordination of an arrangement of the second facets 25 such that between the resulting pupil rods 34 the smallest possible gaps arise within desired illumination regions of the entrance pupil 12a. The result is, in particular, a small variation of the pupil with respect to different x-coordinates on the reticle 12. The effect of a migration of an intensity distribution of the illumination light 3 in the entrance pupil 12a during the y-scanning in the x-direction is damped or even completely suppressed on account of this homogenization of the entrance pupil 12a.

Each of the pupil rods 34 is illuminated via precisely one illumination light illumination channel to which exactly one transfer facet group 28 and exactly one illumination predefinition facet 25 belong. A σ$_x$/σ$_y$-grid arrangement of the pupil rods 34 in the pupil 12a corresponds to an x/y-grid arrangement of the illumination predefinition facets 25 on the illumination predefinition facet mirror 7.

In the case of the illumination of the pupil 12a according to FIG. 6, apart from the pupil rods 34 near the edges 33 of the illumination poles 31, 32, all pupil rods 34 in the direction of the σ$_y$-coordinate are of the same length.

FIG. 7 shows schematically a partial field 35, which is illuminated via an illumination channel of precisely one of the pupil rods 34. The object field 8 is indicated in a dash-dotted manner in FIG. 7. A boundary of the partial field 35 within the object field 8 is illustrated in a dashed manner. The partial field 35 has an x-extension of $x_{F1}$ and a y-extension of $y_{F1}$. The following holds true:

$x_{F1} < x_0$ and $y_{F1} = y_0$. In the x-extension, therefore, the partial field 35 has a smaller extent than the object field 8. The extent of the partial field 35 in the scan direction y corresponds to the extent of the object field 8. Alternatively, the following can also hold true: $x_{F1} = x_0$ and/or $y_{F1} < y_0$.

Those pupil rods 34 which near the edges 33 have a smaller σ$_y$-extension than the other pupil rods 34 belong to illumination channels which illuminate in the object field 8 partial fields whose y-extension at least for some sections of the illuminated partial field is smaller than the y-extension $y_0$ of the object field 8.

FIG. 8 shows an enlarged excerpt from the hexagonal arrangement of the second facets 25 of the second facet mirror 7. This arrangement of the second facets 25 is in a hexagonal grid having a grid constant corresponding to a distance between centres of adjacent second facets 25. Since a closest hexagonal packing is involved, the grid constant is equal to an external diameter d of the circular second facets 25. The arrangement of the second facets 25 of the second facet mirror 7 is such that the grid constant is not strictly constant over the entire second facet mirror 7. Deviations of a local grid constant from a mean grid constant serve to take account of optical boundary conditions on account of different spatial beam guiding geometries for the illumination light partial beams.

The grid constant d of the hexagonal arrangement grid of the second facets 25 is predefined by the position of the second facet mirror 7, zSR, the position of the entrance pupil, zEP, and by a scan length $y_0$, that is to say by the y-extension of the object field 8.

The following holds true:

$$d = \frac{2|zSR|}{(n+1)\sqrt{3}} y_0 \left( \frac{1}{zEP} - \frac{1}{zSR} \right) \quad (1)$$

zEP and zSR in this case are z-coordinates of firstly the pupil plane 12b and secondly the second facet mirror 7.

In this case, n indicates how much individual pupil rods 34 overlap one another. In the case of n=1, pupil rods 34 that are adjacent in the y-direction with an identical x-coordinate precisely abut one another. There is then an overlap between adjacent pupil rods 34 only on account of a finite extent of the light source 2. For n=2, a respective one of the pupil rods 34 overlaps by half its respective neighbour having an identical x-coordinate in the y-direction.

Figure 9:
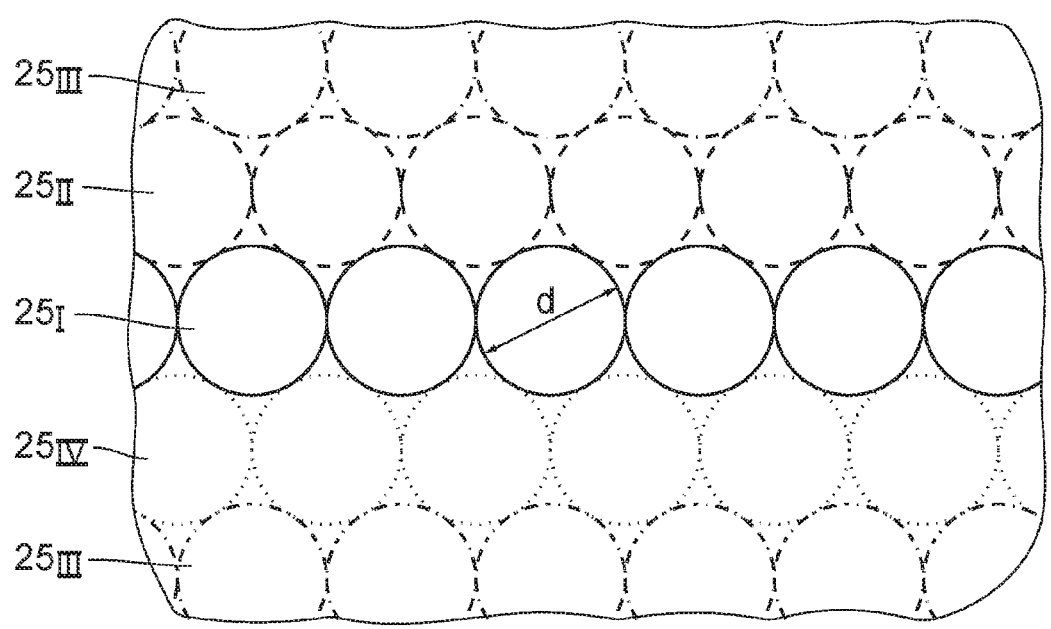
FIG. 9 shows in an enlarged view the arrangement of the illumination predefinition facets according to FIG. 8, wherein the illumination predefinition facets are highlighted line by line via different broken lines.

FIG. 9 shows the hexagonal arrangement of the second facets 25 in an illustration similar to FIG. 8. In FIG. 9, the second facets 25 are highlighted differently line by line via different broken lines of their boundary. This distinction is reproduced in FIG. 9 by a line-by-line type classification I, II . . . of the second facets 25. Overall, a distinction is drawn between four different types $25_I$ to $25_{IV}$ of the second facets 25.

Figure 10:
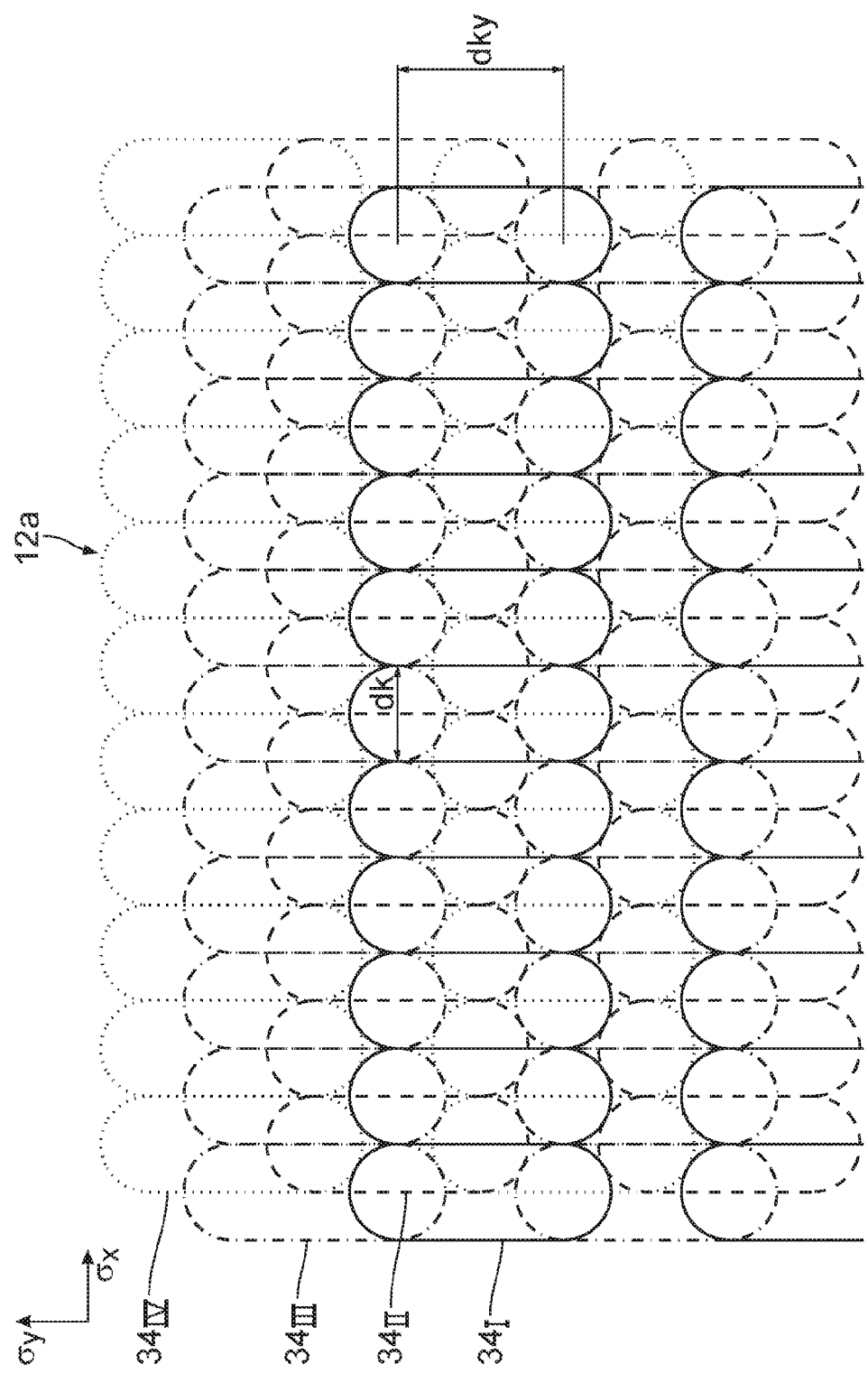
FIG. 10 shows an excerpt from a scan-integrated pupil intensity distribution with use of an arrangement of the illumination predefinition facets according to FIGS. 8 and 9.

FIG. 10 shows, in an illustration similar to FIG. 6, the scan-integrated pupil intensity distribution in the case of a predefined illumination setting. This results in pupil rods $34_I$ to $34_{IV}$, which are illuminated with a respective partial beam and the illumination light 3 via the second facets $25_I$ to $25_{IV}$. Broken lines of the pupil rod types $34_I$ to $34_{IV}$ correspond to the broken lines of the types $25_I$ to $25_{IV}$ of the second facets which are assigned thereto via the respective illumination channels.

The pupil rods 34 have an extension of dk in the σ$_x$-direction and an extension dky in the σ$_y$-direction.

The pupil rods $34_I$ to $34_{IV}$ cover the excerpt from the entrance pupil 12a shown in FIG. 10 without gaps and lead to a homogenized intensity distribution over this illuminated excerpt from the entrance pupil 12a. An illumination inhomogeneity on account of a transition during the illumination of an object point on account of the scan displacement thereof through the object field 8 from one illumination light partial beam, assigned to one specific second facet 25, to another illumination light partial beam, assigned to another second facet 25, is thus reduced or completely avoided.

FIG. 10 illustrates by way of example an extended, illuminated pupil region of the entrance pupil 12a, on which the illumination light 3 impinges via a plurality of second facets 25. Within this illuminated pupil region, on account of the gap-free coverage by the pupil rods 34, an area of less than 10% of the pupil region is impinged on by a limit illumination intensity which is less than 10% of a mean illumination intensity that impinges on the pupil region. In actual fact, in the illuminated pupil region according to FIG. 10, the entire area of the pupil region is impinged on by an illumination intensity which is at least 10% of the mean illumination intensity and which is even significantly greater than 10% of the mean illumination intensity. In the case of alternative occupations of the illuminated pupil region with the pupil rods 34, small gaps can also occur between the rods, the total area of the gaps which is illuminated with less than 10% of the mean illumination intensity being in any case less than 10% of the entire illuminated pupil region.

In the overlap regions between adjacent pupil rods 34, the result in a scan-integrated manner is that these pupil regions are illuminated via more than one second facet 25. In actual fact, in the case of the occupation of the illuminated pupil region of the entrance pupil 12a illustrated in FIG. 10, there are overlap regions of more than two pupil rods 34, which are correspondingly also illuminated in a scan-integrated manner via more than two second facets 25, namely via three second facets 25.

In the case of progressive shading of second facets 25 in such a way that no illumination light partial beam is guided via them in each case, pupil regions which are illuminated in a scan-integrated manner via more than one second facet, that is to say in which a plurality of pupil rods 34 overlap in a scan-integrated manner, exhibit a stepwise reduction of the scan-integrated illumination intensity, that is to say not digital behaviour in which a scan-integrated illumination intensity immediately falls to 0 within a partial region corresponding to the pupil rod 34 of the shaded second facet 25.

With the use of an EUV light source 2 for generating the illumination light partial beams $3_i$, the intensity and the cross section of which on the second facets 25 vary by less than a predefined tolerance value, a homogeneous illumination over the respectively predefined pupil region or pupil section to be illuminated with the illumination light 3 results in a scan-integrated manner on account of this occupation of the section of the illumination pupil 12a with the pupil rods $34_I$ to $34_{IV}$. This homogeneous illumination yields, over the pupil regions to be illuminated, an illumination intensity that deviates from a predefined value by less than a predefined tolerance value.

Figure 11:
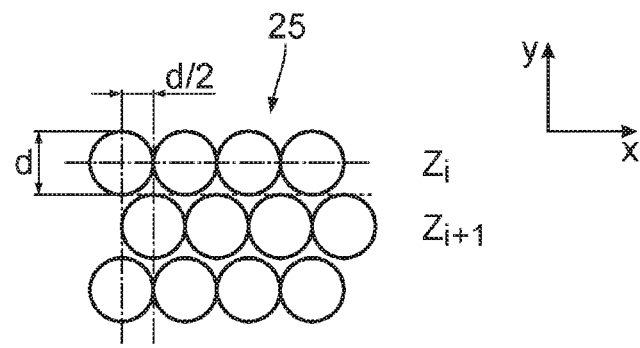
FIG. 11 shows an enlarged excerpt from a facet arrangement of a further embodiment of an illumination predefinition facet mirror, wherein illumination predefinition facets are present in a Cartesian-shifted arrangement in which the illumination predefinition facets of a line of this Cartesian arrangement are in each case shifted relative to the illumination predefinition facets about an adjacent line of this arrangement by half a grid constant of the Cartesian arrangement.
Figure 12:
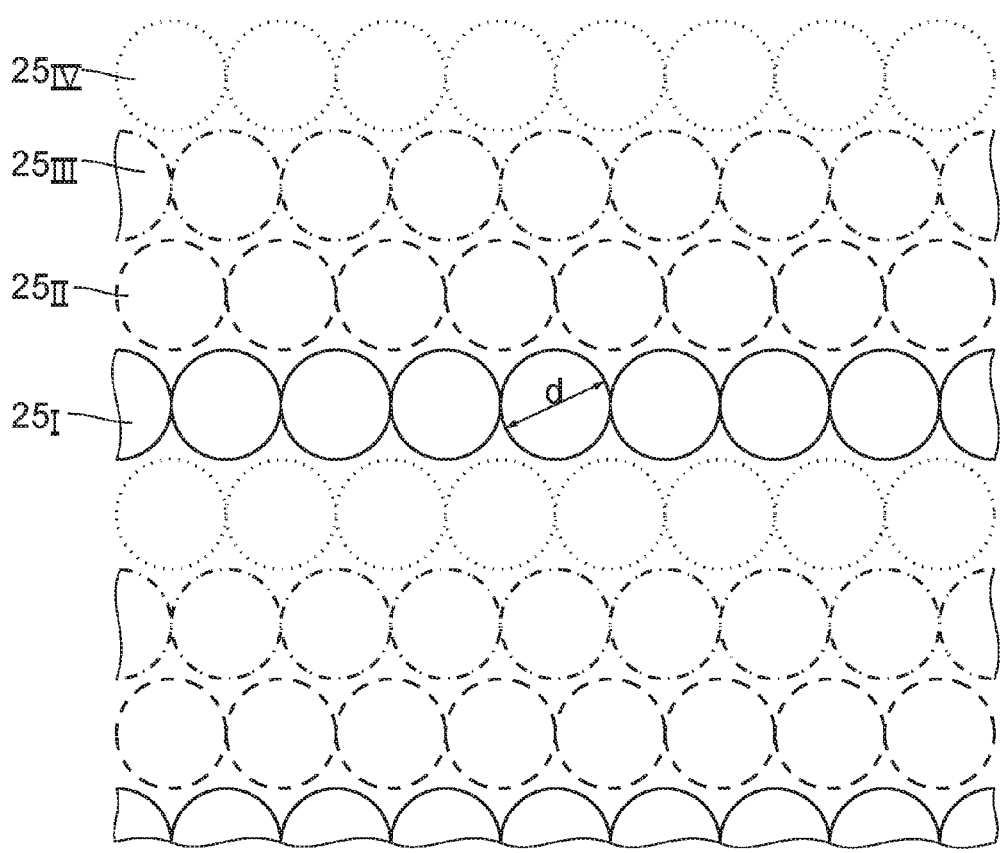
FIG. 12 shows in an enlarged view the arrangement of the illumination predefinition facets according to FIG. 11, wherein the illumination predefinition facets are highlighted line by line via different broken lines.
Figure 13:
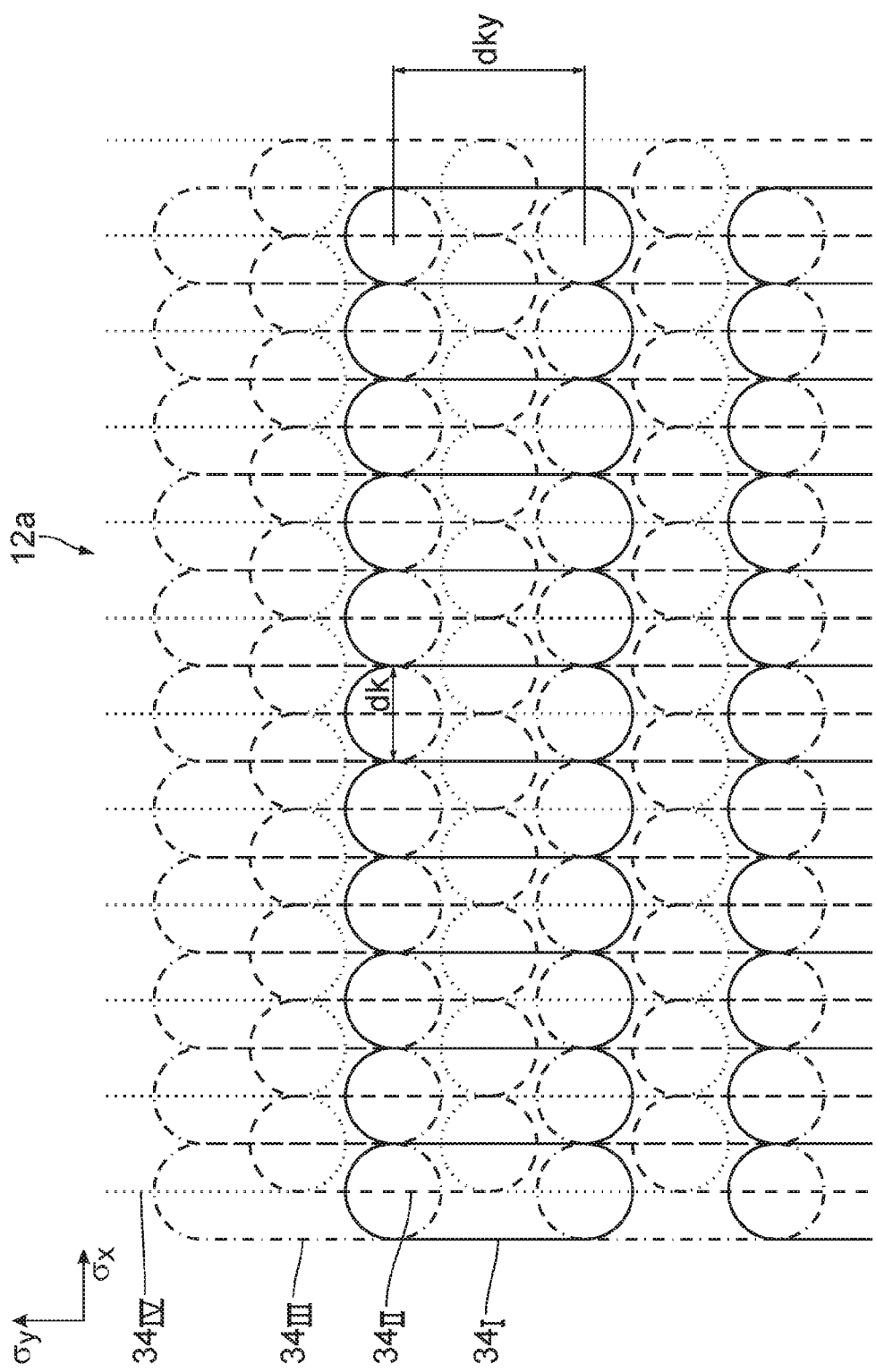
FIG. 13 shows an excerpt from a scan-integrated pupil intensity distribution with use of an arrangement of the illumination predefinition facets according to FIGS. 11 and 12.

FIGS. 11 to 13 show, corresponding to FIGS. 8 to 10, the conditions with the use of a second facet mirror 7 having an alternative grid arrangement of the second facets 25. Components and functions corresponding to those which have already been explained above with reference to FIGS. 1 to 10, and in particular with reference to FIGS. 8 to 10, bear the same reference numerals and will not be explained in detail again.

In the case of the embodiment of the second facet mirror 7 according to FIGS. 11 to 13, the second facets 25 are arranged in a Cartesian grid, once again having a grid constant d corresponding to the external diameter of the second facets 25. Respectively adjacent lines $Z_i$, $Z_{i+1}$ of the second facets 25 extending in the x-direction are shifted relative to one another by half the grid constant, that is to say by d/2. FIGS. 11 and 12 therefore show an example of a shift of adjacent lines $Z_i$-$Z_{i+1}$ of the second facets 25 in a Cartesian arrangement by a submultiple of the grid constants d relative to one another, the submultiple being 2 in this example.

FIG. 12 shows analogously to FIG. 9 once again a type classification of the second facets $25_I$ to $25_{IV}$, and FIG. 13 shows analogously to FIG. 10 a resulting illumination intensity distribution over a section of the entrance pupil 12a with correspondingly type-classified pupil rods $34_I$ to $34_{IV}$.

For the dependence of the grid constant d of the arrangement according to FIGS. 11 and 12 on the scan length $y_0$, the position of the entrance pupil 12a and the position of the second facet mirror 7, the following holds true:

$$d = \frac{|zSR|}{n+1} y_0 \left( \frac{1}{zEP} - \frac{1}{zSR} \right) \quad (2)$$

Figure 14:
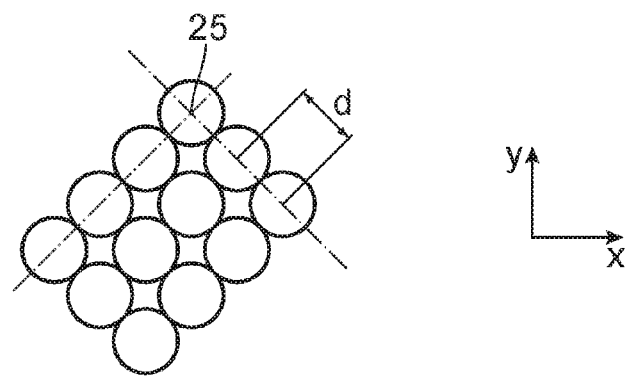
FIG. 14 shows an enlarged excerpt from a facet arrangement of a further embodiment of an illumination predefinition facet mirror, wherein illumination predefinition facets are present in a Cartesian arrangement rotated by 45° in an object displacement direction.
Figure 15:
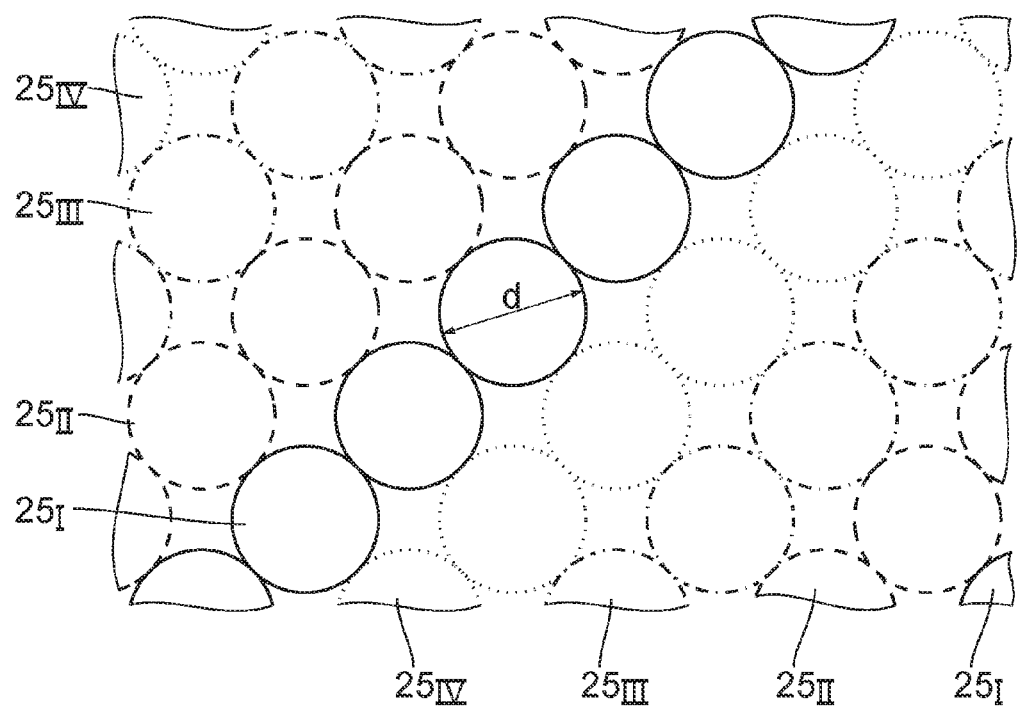
FIG. 15 shows in an enlarged view the arrangement of the illumination predefinition facets according to FIG. 14, wherein the illumination predefinition facets are highlighted line by line via different broken lines.
Figure 16:
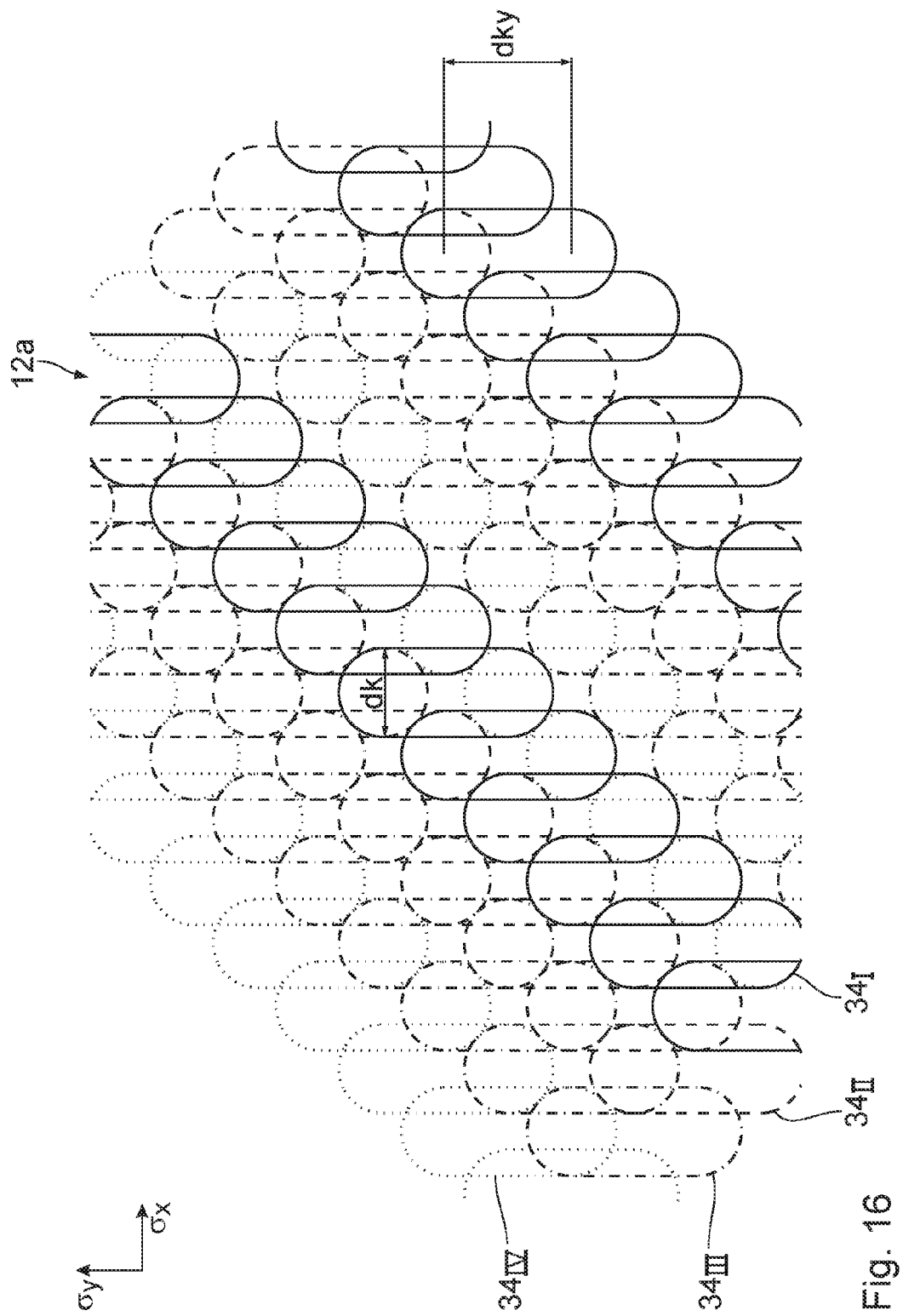
FIG. 16 shows an excerpt from a scan-integrated pupil intensity distribution with use of an arrangement of the illumination predefinition facets according to FIGS. 14 and 15.

FIGS. 14 to 16 show, corresponding to FIGS. 8 to 10, the conditions with the use of a second facet mirror 7 having an alternative grid arrangement of the second facets 25. Components and functions corresponding to those which have already been explained above with reference to FIGS. 1 to 13, and in particular with reference to FIGS. 8 to 13, bear the same reference numerals and will not be explained in detail again.

In the case of the embodiment according to FIGS. 14 to 16, the second facets 25 are arranged in a Cartesian grid, the lines and columns of which extend at an angle of 45° with respect to the object displacement direction y. This is therefore a rotated Cartesian grid having lines and columns not shifted relative to one another. Here, too, the grid constant d is equal to an external diameter of the second facets 25. Rotational angles different from the rotational angle 45° in the embodiment according to FIGS. 14 and 15 are also possible, in particular rotational angles in the range of between 10° and 80°.

FIG. 15 shows analogously to FIG. 9 once again a type classification of the second facets $25_I$ to $25_{IV}$, and FIG. 16 shows analogously to FIG. 10 a resulting illumination intensity distribution over a section of the entrance pupil 12a with correspondingly type-classified pupil rods $34_I$ to $34_{IV}$.

For the dependence of the grid constant d of the arrangement according to FIGS. 15 and 16 on the scan length $y_0$, the position of the entrance pupil 12a and the position of the second facet mirror 7, the following holds true:

$$d = \frac{2|zSR|}{(n+1)\sqrt{2}} y_0 \left( \frac{1}{zEP} - \frac{1}{zSR} \right) \quad (3)$$

Figure 17:
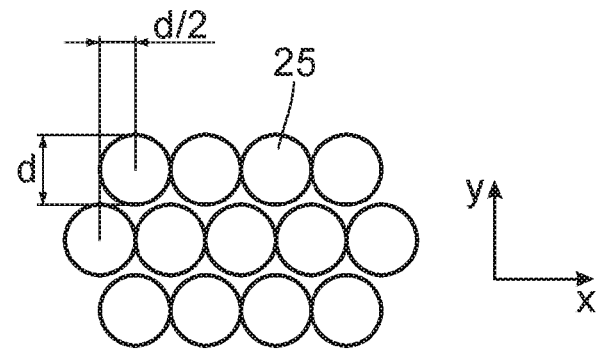
FIG. 17 shows an enlarged excerpt from a facet arrangement of a further embodiment of an illumination predefinition facet mirror, wherein illumination predefinition facets are present in a Cartesian arrangement without rotation relative to an object displacement direction.
Figure 18:
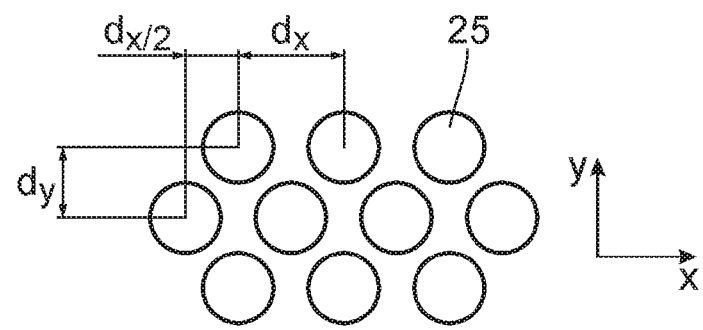
FIGS. 18 and 19 show examples of a Cartesian arrangement of illumination predefinition facets of a further embodiment of the illumination predefinition facet mirror with more than one grid constant, namely with two grid constants.
Figure 19:
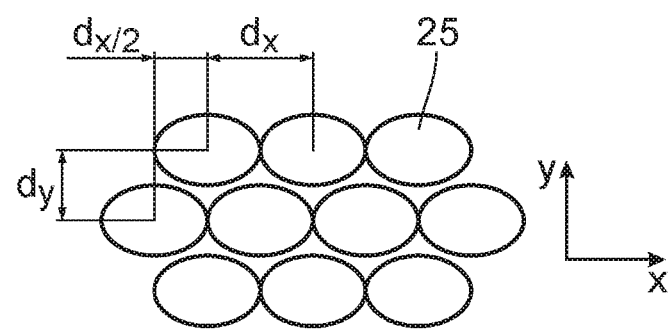

FIGS. 17 to 19 show further possible grid arrangements of the second facets 25 corresponding to further embodiments of the second facet mirror 7. Components and functions corresponding to those which have already been explained above with reference to FIGS. 1 to 16, and in particular to FIGS. 8 to 16, bear the same reference numerals and will not be discussed in detail again.

FIG. 17 shows a non-rotated Cartesian arrangement of the second facets 25, once again having a grid constant d corresponding to an external diameter of the second facets 25. In the case of this non-rotated arrangement, the lines are aligned parallel to the x-direction and the columns are aligned parallel to the y-direction. The lines and columns of the Cartesian grid therefore extend perpendicularly and parallel to the object displacement direction y. Adjacent lines are offset by half the grid constant d/2 in the x-direction with respect to one another.

FIG. 18 shows one example of a Cartesian arrangement of the second facets 25 having two different grid constants $d_x$ and $d_y$ respectively in the x- and y-directions. In this case, the grid constant $d_y$ is equal to an external diameter of the once again round second facets 25. The grid constant $d_x$ is 1.5 times the magnitude of the grid constant $d_y$. Other ratio factors $d_x/d_y$ in the range of between 0.2 and 5 are also possible. Adjacent lines are offset by half the grid constant $d_x/2$ in the x-direction with respect to one another.

The arrangement variant of the second facets 25 according to FIG. 19 has the same grid constant ratio $d_x/d_y$ as the embodiment according to FIG. 18. In contrast to the embodiment in FIG. 18, the second facets 25 of the arrangement according to FIG. 19 are embodied elliptically with the major semiaxis in the x-direction and the minor semiaxis in the y-direction. An x-extent of the elliptical second facets 25 according to FIG. 19 is of exactly the same magnitude as the larger grid constant $d_x$. An extent of the elliptical second facets 25 in the y-direction is equal to the grid constant $d_y$. Adjacent lines are offset by half the grid constant $d_x/2$ in the x-direction with respect to one another.

During the configuration of the illumination optical assembly 11, firstly the design of the illumination optical assembly 11 including the object field dimensions, in particular the scan length $y_0$ and the pupil distance PA between the second facet mirror 7 and the entrance pupil 12a, is predefined. Proceeding therefrom, a grid type of the arrangement of the second facets 25 of the second facet mirror 7 is chosen, wherein here aspects with regard to the integration of the tilting actuators and also thermal aspects may be of importance. Finally, the at least one grid constant d of the chosen grid arrangement is calculated in accordance with the above equations and the second facet mirror 7 is configured with second facets 25 in accordance with the size and grid arrangement.

In order to produce a microstructured component, in particular a highly integrated semiconductor component, for example a memory chip, with the aid of the projection exposure apparatus 1, firstly the reticle 12 and the wafer 19 are provided. Afterwards, a structure on the reticle 12 is projected onto a light-sensitive layer on the wafer 19 via the projection optical assembly of the projection exposure apparatus 1. Via the development of the light-sensitive layer, then a microstructure is produced on the wafer 19 and the micro- or nanostructured component is produced therefrom.

What is claimed is:

1. An illumination optical assembly configured to illuminate an object field, the illumination optical assembly comprising:
   a first facet mirror comprising first facets configured to reflectively guide illumination light;
   a second facet mirror configured to reflectively guide the illumination light reflected by the first facet mirror towards the object field,
   wherein:
      the second facet mirror comprises second facets configured to guide a respective illumination light partial beam into the object field;
      the second facet mirror is a distance from a pupil plane of the illumination optical assembly;
      the illumination optical assembly is configured so that, during use:
         an entrance pupil in the pupil plane comprises a pupil region on which the illumination light impinges with an illumination intensity via a plurality of the second facets;
         when an object is displaced in the object field in an object displacement direction, the illumination intensity is distributed in the pupil plane among pupil sub-structures in the form of pupil rods having a larger extension in the object displacement direction than in a direction perpendicular to the object displacement direction; and
         each pupil rod is illuminated via precisely one illumination light illumination channel to which exactly one group of first facets and exactly one second facet belong; and
      the illumination optical assembly is a projection lithography illumination optical assembly.

2. The illumination optical assembly of claim 1, wherein the illumination optical assembly is configured so that, during use less than 10% of the pupil region is impinged on by a limit illumination intensity which is less than 10% of a mean illumination intensity that impinges on the pupil region.

3. An illumination system, comprising:
   an illumination optical assembly according to claim 1; and
   an EUV light source.

4. An optical system, comprising:
   an illumination optical assembly according to claim 1; and
   a projection optical assembly configured to image the object field into an image field.

5. An apparatus, comprising:
   an illumination optical assembly according to claim 1;
   a projection optical assembly configured to image the object field into an image field; and
   an EUV light source,
   wherein the apparatus is a projection exposure apparatus.

6. A method of using a projection exposure apparatus comprising an illumination optical assembly and a projection optical assembly, the method comprising:
   using the illumination optical assembly to illuminate a section of a reticle;
   using the projection optical assembly to project the illuminated section onto a light sensitive material,
   wherein the illumination optical assembly is an illumination optical assembly according to claim 1.

7. The illumination optical assembly of claim 1, wherein:
   the second facet mirror is a pupil distance from a pupil plane of the illumination optical assembly that is closest adjacent to the second facet mirror;
   the illumination optical assembly is configured so that, during use, an object in the object field is displaced in a displacement direction having a scan length; and
   the second facets are arranged in a grid having a grid constant predefined by the pupil distance and the scan length.

8. The illumination optical assembly of claim 7, wherein the second facets are arranged in a Cartesian grid having lines and columns which extend perpendicularly and parallel to the object displacement direction.

9. The illumination optical assembly of claim 7, wherein the second facets are arranged in a hexagonal grid.

10. The illumination optical assembly of claim 7, wherein the second facets are arranged in a Cartesian grid with lines and columns which extend at an angle of between 10° and 80° with respect to the displacement direction.

11. The illumination optical assembly of claim 7, wherein the second facets are arranged in a Cartesian grid having lines and columns which extend at an angle of 45° with respect to the displacement direction.

12. The illumination optical assembly of claim 7, wherein the grid has more than one grid constant.

13. The illumination optical assembly of claim 12, wherein respectively adjacent lines of the second facets which extend perpendicularly to the object displacement direction are shifted relative to one another by a submultiple of the grid constant.

14. The illumination optical assembly of claim 7, wherein the illumination optical assembly is configured so that, during use less than 10% of the pupil region is impinged on by a limit illumination intensity which is less than 10% of a mean illumination intensity that impinges on the pupil region.

15. An illumination system, comprising:
an illumination optical assembly according to claim 7; and
an EUV light source.

16. An optical system, comprising:
an illumination optical assembly according to claim 7; and
a projection optical assembly configured to image the object field into an image field.

17. An apparatus, comprising:
an illumination optical assembly according to claim 7;
a projection optical assembly configured to image the object field into an image field; and
an EUV light source,
wherein the apparatus is a projection exposure apparatus.

18. A method of using a projection exposure apparatus comprising an illumination optical assembly and a projection optical assembly, the method comprising:
using the illumination optical assembly to illuminate a section of a reticle;
using the projection optical assembly to project the illuminated section onto a light sensitive material,
wherein the illumination optical assembly is an illumination optical assembly according to claim 7.

19. The illumination optical assembly of claim 1, wherein:
the illumination optical assembly is configured so that, during use, an object in the object field is displaced in a displacement direction having a scan length; and
the second facets are arranged in a grid having a grid constant predefined by the pupil distance and the scan length.

20. The illumination optical assembly of claim 19, wherein the illumination optical assembly is configured so that, during use, less than 10% of the pupil region is impinged on by a limit illumination intensity which is less than 10% of a mean illumination intensity that impinges on the pupil region.

* * * * *

UNITED STATES PATENT AND TRADEMARK OFFICE
CERTIFICATE OF CORRECTION

PATENT NO. : 9,996,010 B2
APPLICATION NO. : 15/439020
DATED : June 12, 2018
INVENTOR(S) : Martin Endres It is certified that error appears in the above-identified patent and that said Letters Patent is hereby corrected as shown below:

On the Title Page

Item (*) Notice, Line 3, after "0 days." delete "days.".

In the Specification

Column 10, Line 41-49, delete "The extension of the pupil rods 34 in the pupil dimension σy is dependent on a difference between the reciprocal values of the z-coordinates firstly of the entrance pupil 12a and secondly of the second facet mirror 7, that is to say depending on the factor (1/zEP-1/zSR). The variables PA1 and PA2 explained above therefore influence this factor. In addition, the extension of the pupil rods 34 in the pupil dimension $\sigma_y$ is dependent on the y-extension of the object field, that is to say on the scan length $y_0$." insert the same on Column 10, Line 40 as a continuation of the same paragraph.

Signed and Sealed this
Sixteenth Day of October, 2018

Andrei Iancu
*Director of the United States Patent and Trademark Office*